US010845862B2

(12) United States Patent
Kim

(10) Patent No.: US 10,845,862 B2
(45) Date of Patent: Nov. 24, 2020

(54) FOLDABLE DISPLAY APPARATUS AND METHOD OF MANUFACTURING THE SAME

(71) Applicant: Samsung Display Co., Ltd., Yongin-si (KR)

(72) Inventor: Hyeong-Gwon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/204,531

(22) Filed: Nov. 29, 2018

(65) Prior Publication Data

US 2019/0094943 A1 Mar. 28, 2019

Related U.S. Application Data

(63) Continuation of application No. 15/253,228, filed on Aug. 31, 2016, now Pat. No. 10,175,738, which is a
(Continued)

(30) Foreign Application Priority Data

Jul. 22, 2013 (KR) .......................... 10-2013-0086252

(51) Int. Cl.
*G06F 3/041* (2006.01)
*G06F 3/045* (2006.01)
(Continued)

(52) U.S. Cl.
CPC .......... *G06F 1/3218* (2013.01); *G06F 1/1616* (2013.01); *G06F 1/1677* (2013.01);
(Continued)

(58) Field of Classification Search
CPC .... G06F 1/3218; G06F 1/1616; G06F 1/1677; G06F 1/3265; H01L 27/3225;
(Continued)

(56) References Cited

U.S. PATENT DOCUMENTS 8,436,819 B2 5/2013 Huang et al.
8,703,622 B2 4/2014 Ha
(Continued)

FOREIGN PATENT DOCUMENTS

KR 10-2008-0065210 7/2008
KR 10-2009-0087303 8/2009
(Continued)

OTHER PUBLICATIONS

Non-Final Office Action dated Oct. 29, 2015, in U.S. Appl. No. 14/098,949.
(Continued)

*Primary Examiner* — Brandon S Cole
(74) *Attorney, Agent, or Firm* — H.C. Park & Associates, PLC

(57) ABSTRACT

A foldable display apparatus, a method of manufacturing the same, and a controlling method of the same are disclosed. The foldable display apparatus includes a substrate including a metal thin film and an insulating layer provided on the metal thin film, an organic light-emitting unit formed on the substrate and emitting light in an direction away from the substrate, and a thin film encapsulating layer for encapsulating the organic light-emitting unit. The foldable display apparatus may be folded in a direction such that the metal thin film is exposed.

19 Claims, 4 Drawing Sheets

Related U.S. Application Data continuation of application No. 14/098,949, filed on Dec. 6, 2013, now Pat. No. 9,455,306.

(51) Int. Cl.
| | |
|---|---|
| *G06F 3/043* | (2006.01) |
| *H01J 1/00* | (2006.01) |
| *G02F 1/13* | (2006.01) |
| *G06F 3/044* | (2006.01) |
| *G06F 1/3218* | (2019.01) |
| *H01L 27/32* | (2006.01) |
| *H01L 51/00* | (2006.01) |
| *H01L 51/52* | (2006.01) |
| *G06F 1/16* | (2006.01) |
| *G06F 1/3234* | (2019.01) |
| *H01L 51/56* | (2006.01) |

(52) U.S. Cl.
CPC ........ *G06F 1/3265* (2013.01); *H01L 27/3225* (2013.01); *H01L 27/3269* (2013.01); *H01L 51/0097* (2013.01); *H01L 51/5243* (2013.01); *H01L 51/5253* (2013.01); *H01L 51/56* (2013.01); *H01L 2227/323* (2013.01); *H01L 2251/301* (2013.01); *H01L 2251/5315* (2013.01); *H01L 2251/5338* (2013.01); *H01L 2251/558* (2013.01); *Y02E 10/549* (2013.01); *Y02P 70/521* (2015.11)

(58) Field of Classification Search
CPC ............. H01L 27/3269; H01L 51/0097; H01L 51/5243; H01L 51/5253; H01L 51/56; H01L 2227/323; H01L 2251/301; H01L 2251/5315; H01L 2251/5338; H01L 2251/558; Y02P 70/521; Y02E 10/549
USPC .......................................... 315/291–311; 1/1
See application file for complete search history.

(56) References Cited

U.S. PATENT DOCUMENTS

| | | | |
|---|---|---|---|
| 9,315,663 B2* | 4/2016 | Appleby | C08L 63/00 |
| 9,329,729 B2* | 5/2016 | Kim | G06F 3/044 |
| 2005/0067952 A1 | 3/2005 | Fechter et al. | |
| 2006/0132461 A1 | 6/2006 | Furukawa et al. | |
| 2007/0024272 A1* | 2/2007 | Zentai | G01R 31/2812 |
| | | | 324/763.01 |
| 2007/0087488 A1 | 4/2007 | Moriwaka et al. | |
| 2007/0158648 A1 | 7/2007 | Suh et al. | |
| 2008/0157783 A1* | 7/2008 | Savary | G01R 31/028 |
| | | | 324/548 |
| 2009/0251050 A1 | 10/2009 | Seo | |
| 2010/0066951 A1* | 3/2010 | Kuo | G02F 1/133305 |
| | | | 349/106 |
| 2010/0075447 A1 | 3/2010 | Lee et al. | |
| 2010/0110041 A1 | 5/2010 | Jang | |
| 2010/0181903 A1 | 7/2010 | Kim et al. | |
| 2010/0196716 A1 | 8/2010 | Ohta et al. | |
| 2010/0311489 A1 | 12/2010 | Miller et al. | |
| 2010/0311494 A1 | 12/2010 | Miller et al. | |
| 2011/0057873 A1 | 3/2011 | Geissler et al. | |
| 2011/0084927 A1* | 4/2011 | Chang | G06F 3/0416 |
| | | | 345/173 |
| 2011/0227487 A1 | 9/2011 | Nichol et al. | |
| 2011/0273906 A1 | 11/2011 | Nichol et al. | |
| 2012/0181929 A1 | 7/2012 | Ha | |
| 2012/0241629 A1* | 9/2012 | Kuwabara | A61B 6/4233 |
| | | | 250/362 |
| 2012/0268402 A1 | 10/2012 | Wang et al. | |
| 2012/0293491 A1* | 11/2012 | Wang | G06F 3/044 |
| | | | 345/419 |
| 2013/0100053 A1* | 4/2013 | Kang | G06F 3/044 |
| | | | 345/173 |
| 2013/0126874 A1 | 5/2013 | Jung et al. | |
| 2013/0162549 A1 | 6/2013 | Kim et al. | |
| 2013/0194528 A1 | 8/2013 | Wang et al. | |
| 2013/0229379 A1* | 9/2013 | Joguet | G06F 3/045 |
| | | | 345/173 |
| 2014/0049983 A1* | 2/2014 | Nichol | G02B 6/0018 |
| | | | 362/610 |
| 2014/0055924 A1 | 2/2014 | Baek et al. | |
| 2015/0205418 A1 | 7/2015 | Nam et al. | |

FOREIGN PATENT DOCUMENTS

| | | |
|---|---|---|
| KR | 10-2009-0102065 | 9/2009 |
| KR | 10-2012-0083697 | 7/2012 |

OTHER PUBLICATIONS

Final Office Action dated Feb. 8, 2016, in U.S. Appl. No. 14/098,949.
Notice of Allowance dated May 31, 2016, in U.S. Appl. No. 14/098,949.
Notice of Allowance dated Aug. 30, 2018, in U.S. Appl. No. 15/253,228.
Final Office Action dated Apr. 12, 2018, in U.S. Appl. No. 15/253,228.
Non-Final Office Action dated Nov. 20, 2017, in U.S. Appl. No. 15/253,228.
Office Action dated Jun. 17, 2019, in Korean Patent Application No. 10-2013-0086252.

* cited by examiner

FOLDABLE DISPLAY APPARATUS AND METHOD OF MANUFACTURING THE SAME

CROSS REFERENCE TO RELATED APPLICATION

This application is a Continuation of U.S. patent application Ser. No. 15/253,228, filed Aug. 31, 2016, which issued as U.S. Pat. No. 10,175,738, which is a Continuation of U.S. patent application Ser. No. 14/098,949, filed Dec. 6, 2013, which issued as U.S. Pat. No. 9,455,306, which claims the benefit of Korean Patent Application No. 10-2013-0086252, filed Jul. 22, 2013, each of which is hereby incorporated by reference for all purposes as if fully set forth herein.

BACKGROUND

Field

Exemplary embodiments of the present invention relate to a foldable display apparatus and a method of manufacturing the same.

Discussion of the Background

Due to technological advancements in the field of display apparatuses, recent research and development has focused on transformable display apparatuses. Some of these display apparatuses may be transformed into various shapes and sizes. For example, some display apparatuses may be folded, rolled, or stretched, even during use. These displays have the advantage of making a large-sized display smaller for ease of transport and storage.

The transformable display apparatus may be transformed into a preset shape or may be transformed into various shapes depending on the specific needs of the user. Thus, in order to display an image correctly when the display apparatus is transformed, it is necessary for the display device to recognize and control the transformed shape of the display apparatus according to the recognized shape.

As a result of the transformation of the display apparatus, however, performance of the display may be negatively affected, or certain properties of the display may be damaged or impaired. Since flexible materials such as plastics are used in the construction of a transformable display apparatus, defects such as the generation of irregular curl, wrapping phenomenon at the display edges, or other distortion may occur with use. Thus, reliability and safety of the display apparatus are increased when changes in display transformation, performance, and damage prevention to the display apparatus are monitored and decreased.

BRIEF SUMMARY OF THE INVENTION

Exemplary embodiments of the present invention include a foldable display apparatus and a method of manufacturing the same. Technical objects of exemplary embodiments are not limited to those described above. However, other objects may be inferred from the following exemplary embodiments.

Additional aspects will be set forth in part in the description which follows and, in part, will be apparent from the description, or may be learned by practice of the presented embodiments.

According to one or more exemplary embodiments of the present invention, a foldable display apparatus includes a substrate including a metal thin film and an insulating layer provided on the metal thin film, an organic light-emitting unit formed on the substrate and emitting light away from the substrate, and a thin film encapsulating layer surrounding the organic light-emitting unit. The foldable display apparatus may be folded in a direction of exposing the metal thin film outside.

According to one or more embodiments of the present invention, a method of manufacturing a foldable apparatus includes forming an insulating layer, forming an organic light-emitting unit on the insulating layer that emits light away from insulating layer, forming a thin film encapsulating layer surrounding the organic light-emitting unit, and attaching a metal thin film on a bottom portion of the insulating layer.

According to one or more embodiments of the present invention, a method of controlling a foldable display apparatus is provided. In the method, the foldable display apparatus includes a display region disposed in a center portion, and a peripheral region surrounding the display region. The display region includes an imaginary folding line. The peripheral region includes a first sensor and a second sensor, disposed symmetrically over the imaginary folding line. The method further includes obtaining variable electric signals according to a folding state of the foldable display apparatus by using the first sensor unit and the second sensor unit, and controlling the foldable display apparatus based on the obtained electric signals.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1:
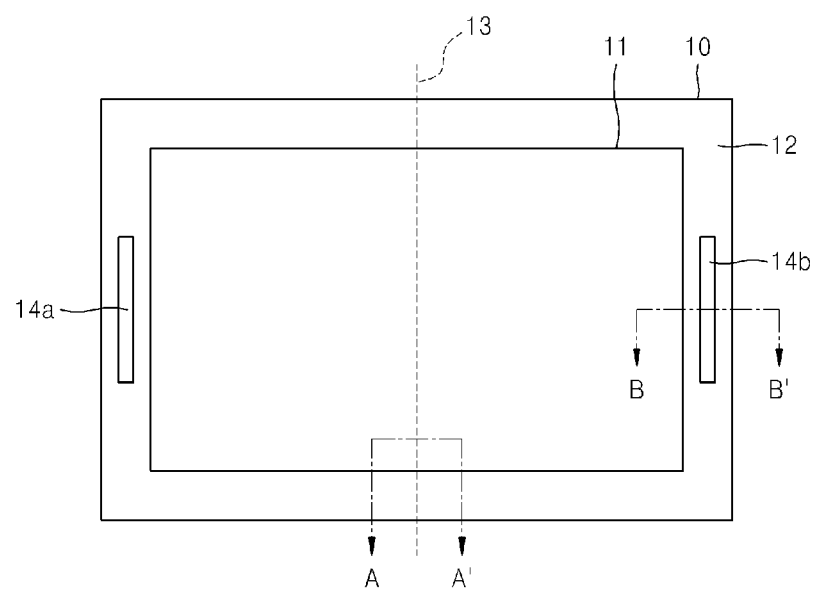
FIG. 1 is a schematic diagram of a foldable display apparatus according to an embodiment of the inventive concept.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

FIG. 1 is a schematic diagram of a foldable display apparatus in accordance with an exemplary embodiment of the present invention. A foldable display apparatus 10 in accordance with an exemplary embodiment may be a foldable or otherwise flexible display apparatus. Referring to FIG. 1, the foldable display apparatus 10 in accordance with an exemplary embodiment may include a display region 11 disposed at a center portion for displaying an image and a peripheral region 12 surrounding the display region 11. The foldable display apparatus may be folded, for example, along an imaginary folding line 13. The foldable display apparatus 10 may further include a first sensor unit 14a and a second sensor unit 14b, disposed symmetrically with respect to the folding line 13. The first sensor unit 14a and the second sensor unit 14b may be provided in the peripheral region 12 in accordance with an exemplary embodiment. However, the position of the sensor is not limited thereto, and could be disposed at various positions in the peripheral region or the display region.

Figure 2:
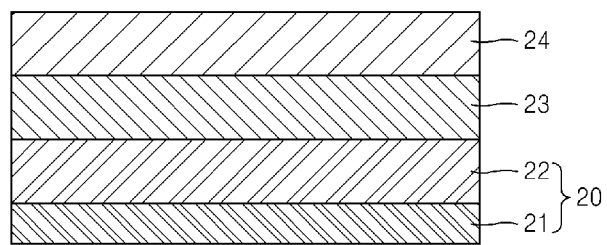
FIG. 2 is a cross-sectional view taken along A-A' in FIG. 1.

FIG. 2 is a cross-sectional view taken along A-A' in FIG. 1. Referring to FIG. 2, the foldable display apparatus 10 may include a substrate 20 including a metal thin film 21 and an insulating layer 22 provided on the metal thin film 21, an organic light-emitting unit 23 formed on the insulating layer 22 and emitting light in a direction away from the substrate 20, and a thin film encapsulating layer 24 for encapsulating the organic light-emitting unit 23.

A method of manufacturing foldable display apparatus 10, with reference to FIG. 2, will now be described. First, an insulating layer 22 may be formed. Then, an organic light-emitting unit 23 emitting light in a direction away from the insulating layer 22 may be formed on the insulating layer 22. A thin film encapsulating layer 24 for encapsulating the organic light-emitting unit 23 may be formed over organic light-emitting unit 23. A metal thin film 21 may be attached on the bottom portion of the insulating layer 22. The upper structure of the insulating layer 22 may include organic light-emitting unit 23 and thin film encapsulating layer 24, which are disposed on insulating layer 22.

In the manufacturing method described above, the forming order of each structure is not limited thereto. For example, after forming the insulating layer 22 and the upper structure of the insulating layer 22 as described above, the metal thin film 21 may be attached on the bottom portion of the insulating layer 22. Alternatively, the metal thin film 21 may be formed first, and the insulating layer 22 and the upper structure of the insulating layer 22 may be formed on the metal thin film 21. These are mere examples and one having ordinary skill in the art would appreciate the many permutations that exist in the forming order of the manufacturing method described above.

Although not illustrated in FIG. 2, at least one interlayer insulating layer may be further formed between the substrate 20 and the thin film encapsulating layer 24 to passivate the foldable display apparatus 10. The first sensor unit 14a and the second sensor unit 14b may be formed on the metal thin film 21. However, the positions of the first sensor unit 14a and the second sensor unit 14b in a cross-sectional view are not limited thereto, and may be positioned on any layer illustrated in FIG. 2.

In accordance with an exemplary embodiment of the inventive concept, the metal thin film 21 may include stainless steel (SUS). The metal thin film 21 may be an ultra-thin type metal layer. The metal thin film 21 may be formed having a small thickness so that a flexible or foldable device may be achieved. For example, the metal thin film 21 may be formed having a thickness of about 30 micrometers or less. In another example, the metal thin film 21 may be formed having a thickness in a range of about 5 micrometers to about 30 micrometers.

The ultra-thin metal thin film 21 formed using the SUS material may be flexible and foldable. The metal thin film 21 may be attached on the bottom side of the insulating layer 22 after forming the insulating layer 22 and the upper structure of the insulating layer 22. However, as stated above, ultra-thin metal thin film 21 may be formed at various times in the manufacturing process, and is not limited to the stated forming order.

By attaching the metal thin film 21 to the bottom side of the foldable display apparatus 10, as shown in FIG. 2, distortion or irregular deformation due to heat may be decreased, thereby achieving increased durability, reliability, and safety of the foldable display apparatus 10.

The metal thin film 21 may be attached on the bottom portion of the insulating layer 22. When the surface of the metal thin film 21 is rough or crooked, the thin film devices formed on the upper portion of the insulating layer 22 may be damaged. Thus, a smooth polishing may be used to control the surface roughness of the metal thin film 21, without affecting the lifetime and the reliability of the foldable display apparatus 10. The surface of the metal thin film 21 may be polished by a chemical mechanical polishing (CMP) method or an electrolytic polishing method. The roughness of the polished metal thin film 21 may be controlled to have a smoothness of a few nanometers.

The insulating layer 22 may be formed by using flexible, plastic materials having good heat-resistance and durability, such as polyethylene terephthalate, polyethylene naphthalate, polycarbonate, polyarylate, polyetherimide, polyethersulfone, polyimide, and similar materials. The materials of the insulating layer 22 of the present invention are not limited thereto, and various flexible materials may be used as the insulating layer 22. The substrate 20 including the metal thin film 21 and the insulating layer 22 may also be flexible.

Figure 3:
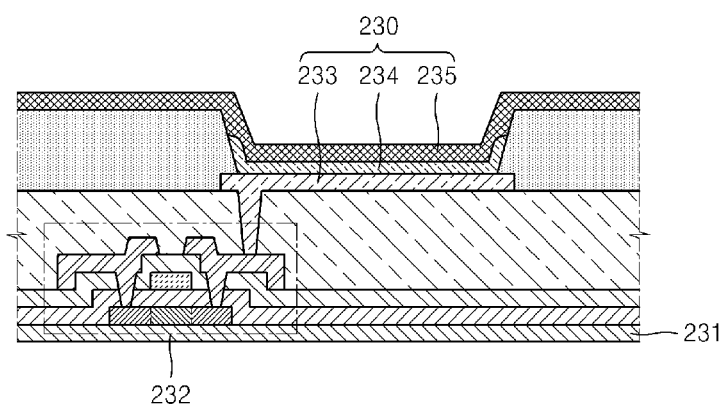
FIG. 3 is a cross-sectional view of an organic light-emitting unit 23 in FIG. 2 in accordance with an exemplary embodiment.

The organic light-emitting unit 23 may include a thin film transistor and an organic light-emitting device (OLED). FIG. 3 is a cross-sectional view of an organic light-emitting unit 23 in FIG. 2 in accordance with an exemplary embodiment. Referring to FIG. 3, the organic light-emitting unit 23 may include at least one organic light-emitting device (OLED) 230. The organic light-emitting device (OLED) 230 may include a pixel electrode 233, an opposite electrode 235, which is a common layer, and a light-emitting layer 234 disposed therebetween. The pixel electrode 233 makes an electrical connection with a driving thin film transistor 232 formed on the flexible substrate 20. Although not illustrated in FIG. 3, the organic light-emitting device 230 makes an electrical connection with at least one switching thin film transistor and a storage capacitor to emit light. On the surface of the substrate 20 in FIG. 2, a passivation layer 231 may be formed to prevent the diffusion of impurity ions and the penetration of humidity or external air, and may additionally planarize the surface of substrate 20. The organic light-emitting device (OLED) 230 may be formed on the passivation layer 231.

The structure of the thin film transistor 232 is not limited to the structure illustrated in FIG. 3, and thin film transistors having various structures may be applied.

Referring to FIG. 2 again, the thin film encapsulating layer 24 of FIG. 2 may be a flexible thin film encapsulating layer. The thin film encapsulating layer 24 may be formed as a single inorganic layer, a plurality of inorganic layers, or a mixed-layer structure including the inorganic layer and the organic layer. Even though not illustrated in FIG. 2, the foldable display apparatus 10 may further include a passivation film or a polarizing film on the thin film encapsulating layer 24.

The foldable display apparatus 10 may be flexible, and may be a top emission type displaying an image in the direction away from the substrate 20. The foldable display apparatus 10 may also be a bottom emission type, displaying an image in the direction toward the substrate 20. In accordance with an example embodiment of the inventive concept, the foldable display apparatus may be a top emission type, thus the metal thin film 21 may be attached on the bottom portion of the foldable display apparatus 10. In accordance with another exemplary embodiment, the foldable display apparatus may be a bottom emission type. Thus, the metal thin film 21 may be disposed on the top portion of the foldable display apparatus 10. For simplicity, the foldable display apparatus 10 will be described as being the top emission type henceforth, but not limited thereto.

Figure 4:
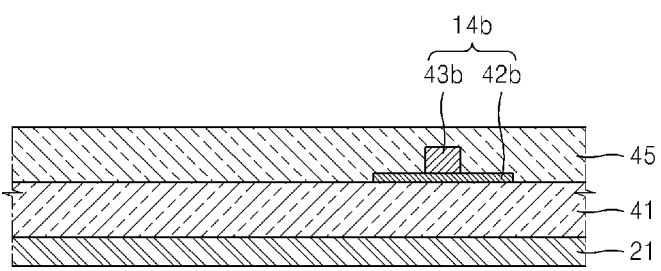
FIG. 4 is a cross-sectional view taken along B-B' in FIG. 1.

The sensor units 14a and 14b in FIG. 1 may be formed on at least one from among the metal thin film 21, the insulating layer 22 and the thin film encapsulating layer 24. FIG. 4 is a cross-sectional view taken along B-B' in FIG. 1. Referring to FIG. 4, the sensor units 14a and 14b may be formed on the metal thin film 21. For convenience, only the second sensor unit 14b is illustrated in FIG. 4, however the same structure may be applied for the first sensor unit (not shown).

Referring to FIG. 4, an insulating layer 41 may be formed on the metal thin film 21 so that the metal thin film 21 is insulated from the sensor unit 14b. However, this configuration is merely exemplary. For example, when the sensor unit 14b includes an element for insulation, the insulating layer 41 may not be separately provided. The sensor unit 14b may include an electrode, and wiring electrically connected with the electrode. Even though not illustrated in FIG. 4, the first sensor unit may also include an electrode and a wiring electrically connected with the electrode, and the wirings may be electrically connected to a circuit unit (not shown) to obtain and transfer electric signals from the electrodes to control the foldable display apparatus 10.

The sensor units 14a and 14b of FIG. 1 may be formed to be symmetrical with respect to folding line 13 on the foldable display apparatus 10. The pattern and the shape of the electrodes included in the sensor units 14a and 14b may be symmetrical with respect to the folding line 13. The size, pattern, and shape of the electrodes may be the same.

Each of the sensor units 14a and 14b may face each other and may together form a capacitor when the foldable display apparatus 10 is folded. The capacitance of the capacitor may be dependent on the materials forming the capacitor between two electrodes, the distance between the electrodes, the characteristics of an overlapping area of the two electrodes, among other factors. Accordingly, the degree of overlap of the two sensor units 14a and 14b, changes in the distance between the first sensor unit 14a and the second sensor unit 14b, and other characteristics of the display may be attained by measuring the capacitance of the capacitor including the first sensor unit 14a and the second sensor unit 14b. Without specific limitation, the capacitor may mean the capacitor formed by the first sensor unit 14a and the second sensor unit 14b, set forth below.

The capacitance of the capacitor may vary according to the folding state of the foldable display apparatus 10. The first sensor unit 14a and the second sensor unit 14b may output variable electric signals according to the folding state of the foldable display apparatus 10. From the electric signals acquired from the first sensor unit 14a and the second sensor unit 14b, the capacitance of the capacitor may be obtained. In addition, from the obtained capacitance, the folding or unfolding state of the foldable display apparatus 10 may be attained. Further, when considering the folding degree or the folding direction of the foldable display apparatus 10, the complete or incomplete folding of the foldable display apparatus 10 or the dislocation of (partial overlap in) a folded direction may be also recognized. As described above, the folding state of the foldable display apparatus 10 may be recognized from the output electric signals of the first sensor unit 14a and the second sensor unit 14b.

Figure 5A:
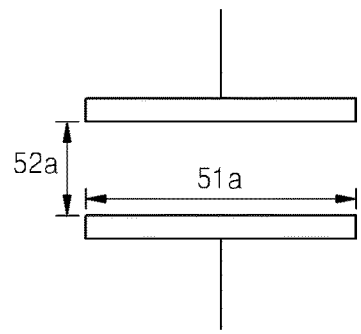
FIGS. 5A, 5B, and 5C illustrate the relationship between a folding state of a foldable display apparatus 10 and capacitance of a capacitor.
Figure 5B:
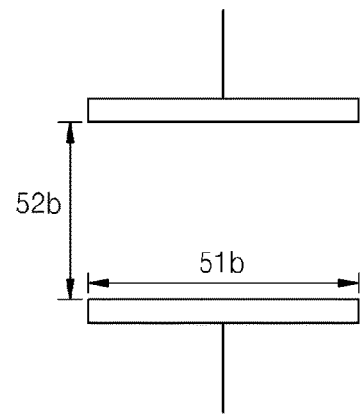
Figure 5C:
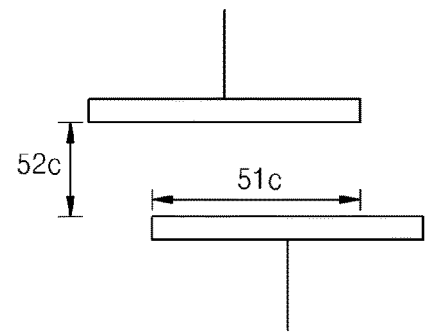

FIGS. 5A to 5C illustrate the relationship between a folding state of a foldable display apparatus 10 and capacitance of a capacitor. In FIGS. 5A to 5C, the positions of the electrode 42a of the first sensor unit 14a and the electrode 42b of the second sensor unit 14b according to the folding state of the foldable display apparatus 10 are illustrated, although the electrode 42a and the electrode 42b are not specifically labeled.

FIG. 5A illustrates the positions of electrode 42a and electrode 42b when foldable display apparatus 10 is folded in a way in which the electrode 42a and the electrode 42b completely overlap. In FIG. 5A, the width 51a of an overlapping region of the electrode 42a and the electrode 42b, and the distance 52a between the electrode 42a and the electrode 42b are illustrated.

In FIG. 5B, an incomplete folding state of the foldable display apparatus 10 is illustrated. Referring to FIG. 5B, the width 51b of an overlapping region of the electrode 42a and the electrode 42b may be the same as the width 51a in FIG. 5A. However, the distance 52b between the electrode 42a and the electrode 42b may be greater than the distance 52a in FIG. 5A. Since the capacitance of a capacitor is inversely proportional to the distance between the two electrodes, the capacitance in FIG. 5B may be smaller than that in FIG. 5A.

FIG. 5C illustrates a folding state of the foldable display apparatus 10 with dislocation (only partial overlap of the electrode 42a and the electrode 42b). Referring to FIG. 5C, the distance 52c between the electrode 42a and the electrode 42b may be the same as the distance 52a in FIG. 5A. However, the width 51c of an overlapping area of the electrode 42a and the electrode 42b is smaller than the width 51a in FIG. 5A. Since the capacitance of a capacitor is proportional to the overlapping area of the two electrodes, the capacitance in FIG. 5C may be smaller than the capacitance in FIG. 5A.

As described above referring to FIGS. 5A to 5C, the capacitance between the first sensor unit 14a and the second sensor unit 14b may be different according to the folding state of the foldable display apparatus 10, and, thus, the electric signal values obtained by the first sensor unit 14a and the second sensor unit 14b may also be different according to the folding state of the foldable display apparatus 10. In this manner, the folding state of the foldable display apparatus 10 may be ascertained by using the electric signals obtained by the first sensor unit 14a and the second sensor unit 14b.

Figure 6:
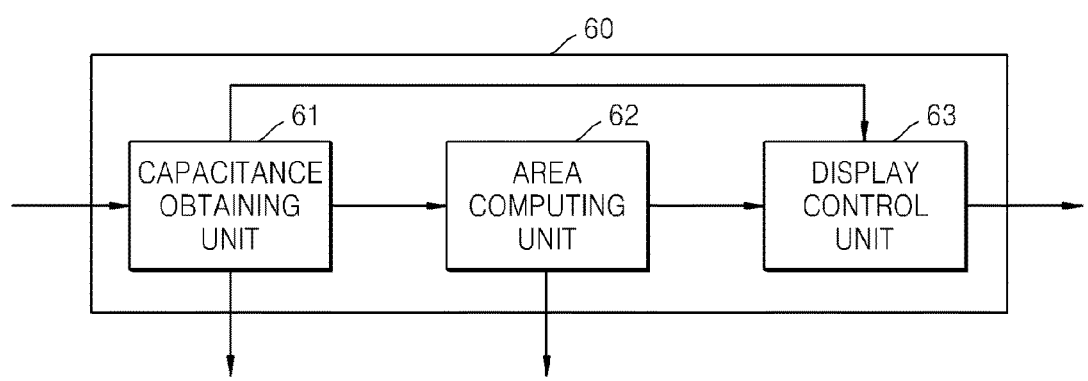
FIG. 6 is a schematic diagram of a control unit 60 for controlling a foldable display apparatus 10 in accordance with an exemplary embodiment of the inventive concept.

FIG. 6 is a schematic diagram of a control unit 60 for controlling a foldable display apparatus 10 in accordance with an exemplary embodiment of the inventive concept. The control unit 60 may control certain aspects of the foldable display apparatus 10 based on the output electric signals from the first sensor unit 14a and the second sensor unit 14b as explained above.

Referring to FIG. 6, the control unit 60 may include a capacitance obtaining unit 61, an area computing unit 62, and a display control unit 63. The capacitance obtaining unit 61 may obtain the capacitance of a capacitor based on the output electric signals from the first sensor unit 14a and the second sensor unit 14b. The control unit 60 may control certain aspects of the foldable display apparatus 10 based on the capacitance obtained by the capacitance obtaining unit 61.

For example, the control unit 60 may operate a preset warning operation when the capacitance of the capacitor is greater than or equal to a first reference value and less than a second reference value. As described above, the capacitance of a capacitor may be dependent on the distance between the first sensor unit 14a and the second sensor unit 14b, an overlapping area therebetween, and various other factors. When the capacitance of the capacitor is greater than or equal to the first reference value, the foldable display apparatus 10 is considered by the control unit 60 as being in a folded state, and when the capacitance is less than the second reference value, the foldable display apparatus 10 is considered by the control unit 60 as being in an incompletely folded state. The control unit 60 may additionally perform a preset warning operation so a user may recognize an incomplete folding of the foldable display apparatus 10.

The area computing unit 62 may ascertain the facing area of the first sensor unit 14a and the second sensor unit 14b based on electric signals that are output by the first sensor unit 14a and the second sensor unit 14b. The facing area is the overlapping area of both electrodes of the capacitor.

In accordance with another exemplary embodiment of the present invention, the control unit 60 may control certain aspects of the foldable display apparatus 10 based on the area obtained by the area computing unit 62.

For example, when the obtained area of the area computing unit 62 is greater than or equal to a preset first reference value and less than a preset second reference value, the control unit 60 may perform a preset warning operation. When the overlapping area of both electrodes of the capacitor is greater than or equal to the first reference value, the foldable display apparatus 10 is considered by the area computing unit 62 as being in a folded state, and when the overlapping area of both electrodes of the capacitor is less than the second reference value, the foldable display apparatus 10 is considered by the area computing unit 62 as being in an incompletely folded state, that is, a partially folded state or a folded state with dislocation (partial overlap). In the case of an incomplete folding state, the control unit 60 may perform a preset warning operation so a user may recognize an incomplete folding of the foldable display apparatus 10.

The warning operation may be performed by outputting a warning sound or by displaying a warning image on a display region, but the warning operation is not limited thereto.

The display control unit 63 may control the display of the foldable display apparatus 10. For example, when the capacitance obtained by the capacitance obtaining unit 61 or the area obtained by the area computing unit 62 is greater than or equal to the second reference value, the display control unit 63 may control the foldable display apparatus 10 in a manner so as not to display an image. That is, when the capacitance or the area is greater than or equal to the second reference value, the foldable display apparatus 10 may be considered by the display control unit 63 as being in a completely folded state within an allowable error range. In this case, the foldable display apparatus 10 may be controlled so as not to display an image.

A user may fold the foldable display apparatus 10 when carrying or storing the foldable display apparatus 10. When the foldable display apparatus 10 is considered by the control unit 60 as being in a folded state, the foldable display apparatus 10 may be controlled in a manner so as not to display an image, thus improving the convenience and providing efficient power management.

The control unit 60, in accordance with an exemplary embodiment of the inventive concept, may include a look-up table for storing the relationship data between the electric signals obtained from the sensor units 14a and 14b and the controlling method of the foldable display apparatus 10 in a dictionary. By using the look-up table, the control unit 60 may determine the controls to be applied to the foldable display apparatus 10 based on the electric signals obtained from the first sensor unit 14a and the second sensor unit 14b.

The look-up table may store the relationship data between the electric signals obtained from the first sensor unit 14a and the second sensor unit 14b, and the control method of the foldable display apparatus 10, but is not limited thereto. The look-up table may store the relationship data between the capacitance obtained by the capacitance obtaining unit 51 and the controlling method of the foldable display apparatus 10, and may store the relationship data between the computed area by the area computing unit 62 and the control method of the foldable display apparatus 10.

The use of the look-up table as described above is just an exemplary embodiment in which the control unit 60 controls the foldable display apparatus 10 based on the electric signals obtained from the sensor units 14a and 14b. However, the method in which the control unit 60 controls certain aspects of the foldable display apparatus 10 based on the electric signals obtained from the sensor units 14a and 14b is not limited thereto.

Figure 7:
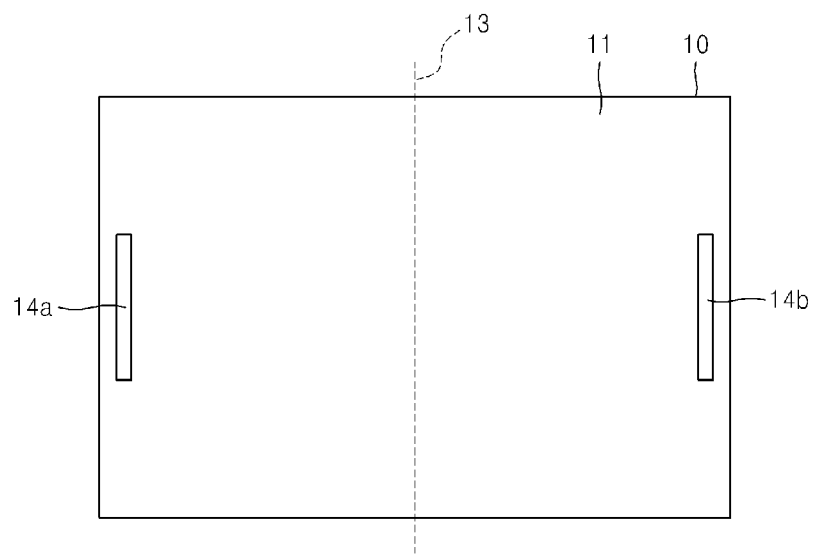
FIG. 7 is a schematic diagram of a foldable display apparatus in accordance with another exemplary embodiment of the inventive concept

FIG. 7 is a schematic diagram of a foldable display apparatus in accordance with another exemplary embodiment of the inventive concept. Referring to FIG. 7, the foldable display apparatus 10 in accordance with another exemplary embodiment of the inventive concept may include a display region 11 for displaying an image, and a first sensor unit 14a and a second sensor unit 14b, disposed symmetrical with respect to an imaginary folding line 13. In accordance with an embodiment of the inventive concept, the first sensor unit 14a and the second sensor unit 14b may be provided on the display region 11.

As described above, damage of a display apparatus due to heat generated while displaying an image or an external impact may be minimized by including a metal thin film 21 on the bottom portion of the foldable display apparatus 10 in accordance with an exemplary embodiment of the inventive concept. In accordance with another exemplary embodiment of the inventive concept, the foldable display apparatus 10 may recognize the folding of the foldable display apparatus 10 by obtaining the capacitance of a capacitor formed by the sensor units 14*a* and 14*b*, which are symmetrical with respect to a folding line. In addition, the completeness of the folding of the foldable display apparatus 10 may be recognized based on the capacitance value, and the foldable display apparatus 10 may be efficiently controlled and managed according to the recognized folding state.

The foldable display apparatus 10 in accordance with an exemplary embodiment of the inventive concept may be applied in various electronic products such as a tablet PC, a portable terminal, an electronic book, and the like.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus comprising:
a metal film;
an insulating layer on the metal film;
a first sensor electrode on the insulating layer;
a second sensor electrode on the insulating layer and spaced apart from the first sensor electrode, the first sensor electrode and the second sensor electrode being disposed on different sides of an imaginary folding line; and
a controller configured to:
determine an extent of a folded state of the display apparatus based on a capacitance between the first sensor electrode and the second sensor electrode; and
control the display apparatus based on the capacitance according to the folded state of the display apparatus,
wherein the metal film is in a different layer than each of the first sensor electrode and the second sensor electrode.

2. The display apparatus of claim 1, wherein:
the display apparatus comprises:
a display region in which an organic light-emitting unit is disposed; and
a peripheral region outside the display region; and
the first sensor electrode and the second sensor electrode are disposed in the peripheral region.

3. The display apparatus of claim 1, wherein:
the display apparatus comprises a display region in which an organic light-emitting unit is disposed; and
the first sensor electrode and the second sensor electrode are disposed in the display region.

4. The display apparatus of claim 1, wherein the metal film comprises stainless steel.

5. The display apparatus of claim 1, wherein a thickness of the metal film is in a range of about 5 micrometers to about 30 micrometers.

6. The display apparatus of claim 1, wherein the metal film comprises a polished surface.

7. A display apparatus comprising:
a metal film;
an insulating layer on the metal film;
a first sensor electrode on the insulating layer;
a second sensor electrode on the insulating layer and spaced apart from the first sensor electrode, the first sensor electrode and the second sensor electrode being disposed on different sides of an imaginary folding line; and
a controller configured to control the display apparatus based on a capacitance between the first sensor electrode and the second sensor electrode according to a folded state of the display apparatus;
an organic light-emitting unit on the insulating layer and comprising:
a pixel electrode;
an opposing electrode; and
a light-emitting layer between the pixel electrode and the opposing electrode; and
an encapsulating layer on the organic light-emitting unit.

8. The display apparatus of claim 7, wherein the encapsulating layer comprises at least one inorganic layer.

9. The display apparatus of claim 7, wherein the encapsulating layer comprises at least one organic layer and at least one inorganic layer.

10. The display apparatus of claim 9, wherein the at least one organic layer and the at least one inorganic layer are alternately stacked.

11. The display apparatus of claim 7 further comprising:
a polarizing member on the encapsulating layer.

12. The display apparatus of claim 7, further comprising:
a passivation layer on the encapsulating layer.

13. The display apparatus of claim 1, further comprising:
wirings electrically connected to the first sensor electrode and the second sensor electrode.

14. The display apparatus of claim 1, wherein the capacitance varies according to the folded state of the display apparatus.

15. The display apparatus of claim 14, wherein the folded state comprises at least one of a distance between the first sensor electrode and the second sensor electrode, and an overlapping area of the first sensor electrode and the second sensor electrode.

16. The display apparatus of claim 1, wherein the controller is configured to output a warning sound or display a warning image on a display region when a value obtained from the capacitance is offset from a preset reference value.

17. The display apparatus of claim 1, wherein the display apparatus is configured to be folded such that the insulating layer is disposed between overlapping portions of the metal film.

18. The display apparatus of claim 1, wherein the display apparatus is configured to be folded such that the metal film is disposed between overlapping portions of the insulating layer.

19. A display apparatus comprising:
a metal film;
an insulating layer on the metal film;
a first sensor electrode on the insulating layer and overlapping the metal film such that the insulating layer is stacked between the first sensor electrode and the metal film;
a second sensor electrode on the insulating layer, spaced apart from the first sensor electrode, and overlapping the metal film such that the insulating layer is stacked between the second sensor electrode and the metal film, the first sensor electrode and the second sensor electrode being disposed on different sides of an imaginary folding line; and a controller configured to control the display apparatus based on a capacitance between the first sensor electrode and the second sensor electrode according to a folded state of a display area of the display apparatus.

* * * * *